United States Patent
Komatsu et al.

(10) Patent No.: US 11,426,761 B2
(45) Date of Patent: Aug. 30, 2022

(54) MODIFICATION METHOD OF SURFACE OF BASE, COMPOSITION, AND POLYMER

(71) Applicant: JSR CORPORATION, Tokyo (JP)

(72) Inventors: Hiroyuki Komatsu, Tokyo (JP); Miki Tamada, Tokyo (JP); Hitoshi Osaki, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 17/000,727

(22) Filed: Aug. 24, 2020

(65) Prior Publication Data

US 2020/0384499 A1 Dec. 10, 2020

Related U.S. Application Data

(63) Continuation of application No. PCT/JP2019/005936, filed on Feb. 18, 2019.

(30) Foreign Application Priority Data

Feb. 28, 2018 (JP) .............................. JP2018-035651

(51) Int. Cl.
| | |
|---|---|
| *B05D 3/00* | (2006.01) |
| *B05D 1/00* | (2006.01) |
| *B05D 3/10* | (2006.01) |
| *B05D 3/02* | (2006.01) |

(Continued)

(52) U.S. Cl.
CPC .................. *B05D 1/62* (2013.01); *B05D 1/60* (2013.01); *B05D 3/107* (2013.01); *B05D 1/005* (2013.01);

(Continued)

(58) Field of Classification Search
CPC ...... B05D 3/107; B05D 1/005; B05D 3/0254; B05D 2202/00; B05D 2203/30
See application file for complete search history.

(56) References Cited

U.S. PATENT DOCUMENTS 9,620,378 B1 * 4/2017 Nakafuji ................. G03F 7/094
2016/0314984 A1 * 10/2016 Matsumura .............. C08G 8/30

FOREIGN PATENT DOCUMENTS

| JP | 2003076036 A | 3/2003 |
| JP | 2016018133 A | 2/2016 |

(Continued)

OTHER PUBLICATIONS

Atsushi Hozumi et al, "Preparation of a Well-Defined Amino-Terminated Self-Assembled Monolayer and Copper Microlines on a Polyimide Substrate Covered with an Oxide Nanoskin". Langmuir, 21, 2005, pp. 8234-8242.

(Continued)

*Primary Examiner* — Hai Y Zhang
(74) *Attorney, Agent, or Firm* — Element IP, PLC (57) ABSTRACT

A modification method of a surface of a base includes applying a composition on a surface layer of a base to form a coating film. The surface layer contains a metal atom. The coating is heated. The composition contains a polymer and a solvent. The polymer includes at an end of a main chain or at an end of a side chain thereof, a functional group that is at least one selected from: a group represented by the following formula (1); a group containing a carbon-carbon triple bond; and a group containing an aromatic hydroxy group. In the formula (1), $R^1$ represents a hydrogen atom or a monovalent organic group having 1 to 20 carbon atoms; and n is an integer of 1 to 10, wherein in a case in which n is no less than 2, a plurality of $R^1$s are identical or different.

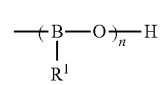

(1)

18 Claims, 2 Drawing Sheets

(51) Int. Cl.
C09D 125/08 (2006.01)
C09D 125/06 (2006.01)
C09D 133/12 (2006.01)
C23C 16/455 (2006.01)

(52) U.S. Cl.
CPC ........ B05D 3/0254 (2013.01); B05D 2202/00 (2013.01); B05D 2202/10 (2013.01); B05D 2202/25 (2013.01); B05D 2202/35 (2013.01); B05D 2202/45 (2013.01); B05D 2203/30 (2013.01); B05D 2518/00 (2013.01); C09D 125/06 (2013.01); C09D 125/08 (2013.01); C09D 133/12 (2013.01); C23C 16/45525 (2013.01)

(56) References Cited

FOREIGN PATENT DOCUMENTS

| JP | 2016025355 A | 2/2016 |
|---|---|---|
| JP | 2016206676 A | 12/2016 |
| JP | 2017125182 A | 7/2017 |
| WO | WO-2014111980 A1 | 7/2014 |
| WO | WO-2017010327 A1 | 1/2017 |

OTHER PUBLICATIONS

Fatemeh Sadat Minaye Hashemi et al, "Self-Correcting Process for High Quality Patterning by Atomic Layer Deposition", ACS NANO, vol. 9, No. 9, 2015, pp. 8710-8717.

Haeshin Lee et al, "Mussel-Inspired Surface Chemistry for Multi-functional Coatings", Science, 318(5849), 2007, pp. 1-10.

International Search Report dated May 21, 2019 in PCT/JP2019/005936 (with English translation), 5 pages.

Ming Fang et al, "Area-Selective Atomic Layer Deposition: Conformal Coating Subnanometer Thickness Control, and Smart Positioning", ACS NANO, vol. 9, No. 9, 2015, pp. 8651-8654.

Written Opinion dated May 21, 2019 in PCT/JP2019/005936 (with English translation), 13 pages.

Office Action dated Apr. 5, 2022 in Japanese Patent Application No. 2020-503412 (with English machine translation), 14 pages.

* cited by examiner

MODIFICATION METHOD OF SURFACE OF BASE, COMPOSITION, AND POLYMER

CROSS-REFERENCE TO RELATED APPLICATIONS

The present application is a continuation application of International Application No. PCT/JP2019/005936, filed Feb. 18, 2019, which claims priority to Japanese Patent Application No. 2018-035651, filed Feb. 28, 2018. The contents of these applications are incorporated herein by reference in their entirety.

BACKGROUND OF THE INVENTION

Field of the Invention

The present invention relates to a modification method of a surface of a base, a composition, and a polymer.

Discussion of the Background

Further miniaturization of semiconductor devices has been accompanied by a demand for a technique of forming a fine pattern of less than 30 nm. However, it is technically difficult to form such a fine pattern by conventional methods employing lithography, due to optical factors and the like.

Therefore, a bottom-up technique, as generally referred to, has been investigated for forming a fine pattern. As the bottom-up technique, in addition to a method employing directed self-assembly of a polymer, a method for selectively modifying a base having a surface layer that includes fine regions has recently come to be studied. Such a method for selective modification requires a material enabling convenient and highly selective modification of surface regions, and various materials have been investigated for such use (see Japanese Unexamined Patent Application, Publication No. 2016-25355; Japanese Unexamined Patent Application, Publication No. 2003-76036; ACS Nano, 9, 9, 8710, 2015; ACS Nano, 9, 9, 8651, 2015; Science, 318, 426, 2007; and Langmuir, 21, 8234, 2005).

SUMMARY OF THE INVENTION

According to an aspect of the present invention, a modification method of a surface of a base includes applying a composition on a surface layer of a base to form a coating film. The surface layer contains a metal atom. The coating is heated. The composition contains a polymer and a solvent. The polymer includes at an end of a main chain or at an end of a side chain thereof, a functional group that is at least one selected from: a group represented by the following formula (1); a group containing a carbon-carbon triple bond; and a group containing an aromatic hydroxy group. In the formula (1), $R^1$ represents a hydrogen atom or a monovalent organic group having 1 to 20 carbon atoms; and n is an integer of 1 to 10, wherein in a case in which n is no less than 2, a plurality of $R^1$s are identical or different.

(1)

According to another aspect of the present invention, a composition includes a polymer and a solvent. The polymer includes at an end of a main chain or at an end of a side chain thereof, a functional group that is at least one selected from: a group represented by the formula (1); a group comprising a carbon-carbon triple bond; and a group comprising an aromatic hydroxy group.

According to a further aspect of the present invention, a polymer includes a group represented by the formula (1) at an end of a main chain or at an end of a side chain thereof.

DESCRIPTION OF EMBODIMENTS

The aforementioned conventional materials are low-molecular materials and therefore have the disadvantages of: being unsuitable for application by spin coating in preexisting processes and requiring a Langmuir-Blodgett method, which is low in efficiency; and being inferior in heat resistance. Thus, it is desired to use a high-molecular material which is high in viscosity and heat resistant. On the other hand, high-molecular materials are incapable of efficiently modifying a base surface due to great steric hindrance. In addition, a technique of readily providing sufficient selectivity is not yet known.

According to an embodiment of the invention, a modification method of a surface of a substrate includes: applying a first composition on a surface of a base having a surface layer containing a metal atom; and heating a coating film formed by the applying, wherein the first composition contains a first polymer and a solvent, the first polymer having at an end of a main chain or at an end of a side chain thereof, a first functional group that is at least one selected from: a group represented by the following formula (1); a group containing a carbon-carbon triple bond; and a group containing an aromatic hydroxy group, (1)

wherein; in the formula (1), $R^1$ represents a hydrogen atom or a monovalent organic group having 1 to 20 carbon atoms; and n is an integer of 1 to 10, wherein in a case in which n is no less than 2, a plurality of $R^1$s are identical or different.

Another embodiment of the present invention is a composition for use in a modification method of a surface of a base, the composition containing a polymer and a solvent, wherein the polymer has at an end of a main chain or at an end of a side chain thereof, a functional group that is at least one selected from: a group represented by the above formula (1); a group containing a carbon-carbon triple bond; and a group containing an aromatic hydroxy group.

Yet another embodiment of the present invention is a polymer having a group represented by the above formula (1) at an end of a main chain or at an end of a side chain thereof.

According to the modification method of a surface of a base, the composition, and the polymer of the embodiments of the present invention, convenient modification of the surface region containing a metal atom is enabled, with superior selectivity and high density. Therefore, the modification method of a surface of a base, and the composition and the polymer can be suitably used for working processes of semiconductor devices, and the like, in which microfabrication is expected to progress further hereafter.

Embodiments of the modification method of a surface of a base (hereinafter, may be merely referred to as "surface modification method") will be described in detail below.

Surface Modification Method

A surface modification method of an embodiment of the present invention includes: a step of providing a base having a surface layer containing a metal atom (hereinafter, may be also referred to as "metal atom (M)") (hereinafter, may be also referred to as "providing step"); a step of applying a first composition (hereinafter, may be also referred to as "composition (I)") on a surface of the base (hereinafter, may be also referred to as "applying step"); and a step of heating a coating film formed by the applying (hereinafter, may be also referred to as "heating step"). In the surface modification method, the composition (I) contains a first polymer (hereinafter, may be also referred to as "(A) polymer" or "polymer (A)") and a solvent (hereinafter, may be also referred to as "(B) solvent" or "solvent (B)"), wherein the polymer (A) has at an end of a main chain or at an end of a side chain thereof, a first functional group (hereinafter, may be also referred to as "functional group (X)") that is at least one selected from: a group represented by the formula (1) (hereinafter, may be also referred to as "group (I)"); a group containing a carbon-carbon triple bond (hereinafter, may be also referred to as "group (II)"); and a group containing an aromatic hydroxy group (hereinafter, may be also referred to as "group (III)"), each being described later.

In the surface modification method, it is preferred that the surface layer includes: a first region (hereinafter, may be also referred to as "region (I)") containing the metal atom (M); and a second region (hereinafter, may be also referred to as "region (II)") not containing the metal atom (M) contained in the region (I). Furthermore, it is preferred that the region (II) substantially consists solely of at least one nonmetal atom (hereinafter, may be also referred to as "nonmetal atom (N)"). According to the surface modification method of the present embodiment, when the surface layer of the base includes both the region (I) and the region (II), the region (I) containing the metal atom (M) can be selectively modified, thereby being capable of providing a selective modification method of a base surface.

It is preferred that the surface modification method further includes after the heating step, a step of removing with a rinse agent a portion of the coating film formed on the region (II) (hereinafter, may be also referred to as "removing step").

Also, the surface modification method may further include, for example: a step of bringing alcohol, dilute acid, ozone or plasma into contact with the surface of the base after the removing step (hereinafter, may be also referred to as "contacting step"); a step of depositing a pattern, by a CVD process or an ALD process, on the surface of the base after the removing step (hereinafter, may be also referred to as "depositing step"); a step of eliminating by etching, the polymer (A) on the surface of the base after the removing step (hereinafter, may be also referred to as "etching step"); and/or the like.

According to the present surface modification method, the substrate can be processed by: selectively modifying the surface of a substrate as the base; and further carrying out the contacting step, the depositing step, the etching step, and/or the like, whereby a processing method of a substrate can be provided. Hereinafter, each step will be described.

Providing Step

In this step, a base having a surface layer containing a metal atom (M) is provided.

The metal atom (M) is not particularly limited as long as it is an atom of a metal element. It is to be noted that a silicon atom is a nonmetal atom and does not fall under the category of the metal atom. Examples of the metal atom (M) include a copper atom, an iron atom, a zinc atom, a cobalt atom, an aluminum atom, a tin atom, a tungsten atom, a zirconium atom, a titanium atom, a tantalum atom, a germanium atom, a molybdenum atom, a ruthenium atom, a gold atom, a silver atom, a platinum atom, a palladium atom, a nickel atom, and the like. Of these, a copper atom, a cobalt atom, a tungsten atom or a tantalum atom is preferred.

The metal atom (M) may be contained in the surface layer in a form of, for example, a metal simple substance, an alloy, an electrically conductive nitride, a metal oxide, a silicide, and/or the like.

Examples of the metal simple substance include simple substances of metals such as copper, iron, cobalt, tungsten, and tantalum, and the like.

Examples of the alloy include a nickel-copper alloy, a cobalt-nickel alloy, a gold-silver alloy, and the like.

Examples of the electrically conductive nitride include tantalum nitride, titanium nitride, iron nitride, aluminum nitride, and the like.

Examples of the metal oxide include tantalum oxide, aluminum oxide, iron oxide, copper oxide, and the like.

Examples of the silicide include iron silicide, molybdenum silicide, and the like.

Of these, the metal simple substance, the alloy, the electric conductive nitride or the silicide is preferred, the metal simple substance or the electric conductive nitride is more preferred, and a copper simple substance, a cobalt simple substance, a tungsten simple substance, a tantalum simple substance, or tantalum nitride is still more preferred.

The surface layer of the base has: the region (I) preferably containing the metal atom (M); and the region (II) not containing the metal atom (M) and preferably substantially consisting solely of at least one nonmetal atom (N).

The nonmetal atom (N) may be contained in the region (II) in a form of, for example, a nonmetal simple substance, a nonmetal oxide, a nonmetal nitride, a nonmetal oxidenitride, and/or the like.

Examples of the nonmetal simple substance include simple substances of silicon, carbon, and the like.

Examples of the nonmetal oxide include silicon oxide, and the like.

Examples of the nonmetal nitride include $SiN_x$, $Si_3N_4$, and the like.

Examples of the nonmetal oxidenitride include SiON, and the like.

Of these, the nonmetal oxide is preferred, and the silicon oxide is more preferred.

A mode of the arrangement of the region (I) and the region (II) on the surface layer of the base is not particularly limited, and is exemplified by surficial shapes, spots, stripes, and other shapes in a planar view. The sizes of the region (I) and the region (II) are not particularly limited, and regions having a desired size may be provided as appropriate.

The shape of the base is not particularly limited, and may be made into a desired shape such as a plate shape (substrate) or a spherical shape, as appropriate.

Applying Step

In this step, the composition (I) is applied on the surface of the base.

The application procedure of the composition (I) is exemplified by a spin-coating method, and the like.

Composition (I)

The composition (I) contains the polymer (A) and the solvent (B). The composition (I) may contain other component(s) in addition to the polymer (A) and the solvent (B). Polymer (A) The polymer (A) has the functional group (X) at an end of a main chain or at an end of a side chain thereof. The "main chain" as referred to herein means the longest one of the atom chains of a polymer. The "side chain" as referred to herein means an atom chain of a polymer other than the main chain. The phrase "having the functional group (X) at an end of a side chain" as referred to herein includes a case in which the functional group (X) is an entirety of the side chain of the polymer.

The polymer (A) having the functional group (X) at the end of the side chain thereof is exemplified by a polymer that includes a structural unit (hereinafter, may be also referred to as "structural unit (I)") derived from a monomer having the functional group (X) at the end thereof and having an ethylenic carbon-carbon double bond, and the like.

In light of further increasing the density of the polymer (A) with which the surface is modified, the polymer (A) has the functional group (X) preferably at one or both ends of the main chain thereof, and more preferably at the end of one main chain thereof.

Functional Group (X)

The functional group (X) is at least one selected from: the group (I); the group (II); and the group (III). The functional group (X) is considered to be capable of further strongly bonding to the metal atom (M), and as a result, the modification method of a surface of a base is believed to enable the surface region containing the metal atom to be modified conveniently, with high selectivity and high density. This bonding is, for example, via a chemical bond, which is exemplified by a covalent bond, an ionic bond, a coordinate bond, and the like. Of these, the coordinate bond is preferred in light of enabling more potent binding force between the metal atom and the functional group. In the following, the group (I), the group (II), and the group (III) will be described in this order.

Group (I)

The group (I) is a group represented by the following formula (1).

(1)

In the above formula (1), $R^1$ represents a hydrogen atom or a monovalent organic group having 1 to 20 carbon atoms; and n is an integer of 1 to 10, wherein in a case in which n is no less than 2, a plurality of $R^1$s are identical or different.

The "organic group" as referred to herein means a group having at least one carbon atom. The monovalent organic group having 1 to 20 carbon atoms represented by is exemplified by: a monovalent hydrocarbon group having 1 to 20 carbon atoms; a group (α) that includes a divalent hetero atom-containing group between two adjacent carbon atoms or at the end of the atomic-bonding side of the hydrocarbon group having 1 to 20 carbon atoms; a group obtained by substituting, with a monovalent hetero atom-containing group, a part or all of hydrogen atoms included in the hydrocarbon group having 1 to 20 carbon atoms or in the group (α); and the like.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

The "hydrocarbon group" as referred to herein may be a chain hydrocarbon group, an alicyclic hydrocarbon group, or an aromatic hydrocarbon group. The "hydrocarbon group" may be either a saturated hydrocarbon group or an unsaturated hydrocarbon group. The "chain hydrocarbon group" as referred to herein means a hydrocarbon group not including a cyclic structure but being constituted with only a chain structure, and both a linear hydrocarbon group and a branched hydrocarbon group may be included. The "alicyclic hydrocarbon group" as referred to herein means a hydrocarbon group that includes, as a ring structure, not an aromatic ring structure but an alicyclic structure alone, and may include both a monocyclic alicyclic hydrocarbon group and a polycyclic alicyclic hydrocarbon group. In this regard, it is not necessary for the alicyclic hydrocarbon group to be constituted with only an alicyclic structure; it may include a chain structure in a part thereof. The "aromatic hydrocarbon group" as referred to herein means a hydrocarbon group that includes an aromatic ring structure as a ring structure. In this regard, it is not necessary for the aromatic hydrocarbon group to be constituted with only an aromatic ring structure; it may include a chain structure or an alicyclic structure in a part thereof.

Examples of the monovalent chain hydrocarbon group having 1 to 20 carbon atoms include:
  alkyl groups such as a methyl group, an ethyl group, an n-propyl group and an i-propyl group;
  alkenyl groups such as an ethenyl group, a propenyl group and a butenyl group;
  alkynyl groups such as an ethynyl group, a propynyl group and a butynyl group; and the like.

Examples of the monovalent alicyclic hydrocarbon group having 3 to 2.0 carbon atoms include:
  monocyclic alicyclic saturated hydrocarbon groups such as a cyclopentyl group and a cyclohexyl group;
  monocyclic alicyclic unsaturated hydrocarbon groups such as a cyclopentenyl group and a cyclohexenyl group;
  polycyclic alicyclic saturated hydrocarbon groups such as a norbornyl group, an adamantyl group and a tricyclodecyl group;
  polycyclic alicyclic unsaturated hydrocarbon groups such as a norbornenyl group and a tricyclodecenyl group; and the like.

Examples of the monovalent aromatic hydrocarbon group having 6 to 20 carbon atoms include:
  aryl groups such as a phenyl group, a tolyl group, a xylyl group, a naphthyl group and an anthryl group;
  aralkyl groups such as a benzyl group, a phenethyl group, a naphthylmethyl group and an anthrylmethyl group; and the like.

The hetero atom that may constitute the monovalent or divalent hetero containing group is exemplified by an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atone, and the like.

Examples of the divalent hetero atom-containing group include —O—, —CO—, —S—, —CS—, —NR'—, groups obtained by combining at least two of these, and the like, wherein R' represents a hydrogen atom or a monovalent hydrocarbon group.

Examples of the monovalent hetero atom-containing group include a halogen atom, a hydroxy group, a carboxy group, a cyano group, an amino group, a sulfanyl group, and the like.

$R^1$ represents preferably a substituted or unsubstituted monovalent hydrocarbon group, more preferably a substituted or unsubstituted monovalent aromatic hydrocarbon group, still more preferably a substituted or unsubstituted aryl group, and particularly preferably a substituted or unsubstituted phenyl group.

Examples of the substituent for the hydrocarbon group in $R^1$ include: alkyl groups such as a methyl group and an ethyl group; alkoxy groups such as a methoxy group and an ethoxy group; halogen atoms; and the like.

Examples of the group (I) include groups represented by the following formulae, and the like.

In the above formulae, "3m" denotes "m multiplied by 3", indicating the number of repeated —B—O—; and m is an integer of 1 to 3.

Group (II)

The group (II) is a group containing a carbon-carbon triple bond.

Examples of the group (II) include:
an ethynyl group, groups including an ethynyl group, such as a propargyl group, a 1-butyn-4-yl group, and an ethynyl phenyl group;
substituted ethynyl groups such as a 1-propyn-1-yl group, a 1-butyn-1-yl group, and a phenylethynyl group;
groups containing an internal carbon-carbon triple bond, such as a 2-butyn-1-yl group and a 4-phenyl-2-butyn-1-yl group; and the like.

Group (III)

The group (III) is a group containing an aromatic hydroxy group. The "aromatic hydroxy group" as referred to herein means an —OH group bonding to a carbon atom of an aromatic carbon ring such as a benzene ring or a naphthalene ring.

Examples of the group MD include a group represented by the following formula (2), and the like.

In the above formula (2), Ar represents a group obtained by removing (p+q+1) hydrogen atoms on an aromatic ring from an arene having 6 to 20 carbon atoms; p is an integer of 0 to 11, wherein in a case in which p is 1, $R^2$ represents a halogen atom, a nitro group, or a monovalent organic group having 1 to 20 carbon atoms, and in a case in which p is no less than 2, a plurality of $R^2$s are identical or different and represent a halogen atom, a nitro group, or a monovalent organic group having 1 to 20 carbon atoms, or two or more of the plurality of $R^2$s taken together represent a ring structure having 4 to 20 ring atoms together with the carbon chain to which the two or more of the plurality of $R^2$s bond; q is an integer of 1 to 11, wherein a sum of p and q is no greater than 11; $R^3$ represents a single bond or a divalent organic group having 1 to 20 carbon atoms; and * denotes a site bonding to part other than the group represented by the above formula (2) in the polymer (A).

Examples of the arene having 6 to 20 carbon atoms that gives Ar include benzene, naphthalene, anthracene, phenanthrene, tetracene, pyrene, and the like. Of these, benzene or naphthalene is preferred.

Examples of the monovalent organic group having 1 to 20 carbon atoms which may be represented by $R^2$ include groups similar to those exemplified as the monovalent organic group which may be represented by $R^2$ in the above formula (1), and the like.

$R^2$ represents preferably the monovalent hydrocarbon group or a halogen atom, and more preferably the monovalent chain hydrocarbon group, a fluorine atom or a chlorine atom.

Examples of the ring structure having 4 to 20 ring atoms which may be represented by two or more of the plurality of $R^2$s include cycloalkene structures such as a cyclobutene structure, a cyclopentene structure, and a cyclohexene structure, and the like.

In the above formula (2), p is preferably 0 to 2, more preferably 0 or 1, and still more preferably 0.

In the above formula (2), q is preferably 1 to 3, more preferably 1 or 2, and still more preferably 1.

Examples of the divalent organic group having 1 to 20 carbon atoms which may be represented by $R^3$ include groups obtained by removing one hydrogen atom from the group exemplified as the monovalent organic group which may be represented by $R^1$ in the above formula (1), and the like.

$R^3$ represents preferably a single bond, a divalent hydrocarbon group, or a divalent group represented by —X—R"— (wherein X represents an oxygen atom or a sulfur atom, and R" represents a divalent hydrocarbon group), more preferably a single bond or a sulfanylalkanediyl group, and still more preferably a single bond or a sulfanylpropanediyl group.

Examples of the group (III) include groups represented by the following formulae, and the like.

In the above formulae, $R^3$ is as defined in the above formula (2); and * denotes a site bonding to part other than the aforementioned group in the polymer (A).

The polymer (A) having the functional group (X) at the end of the main chain thereof has, for example: a structural unit derived from substituted or unsubstituted styrene; a structural unit derived from (meth)acrylic acid or a (meth) acrylic acid ester; a structural unit derived from substituted or unsubstituted ethylene; a structural unit that includes a crosslinkable group; and/or the like. The polymer (A) may have one, or two or more types of each of these structural units. It is to be noted that the "crosslinkable group" as referred to herein means a group capable of forming a cross-linked structure through a reaction under heating conditions, under conditions involving radiation with an active energy ray, under acidic conditions or the like.

Examples of a monomer that gives the structural unit derived from substituted or unsubstituted styrene include styrene, α-methylstyrene, o-methylstyrene, m-methylstyrene, p-methylstyrene, p-t-butylstyrene, 2,4,6-trimethyl styrene, p-methoxystyrene, p-t-butoxystyrene, o-vinylstyrene, m-vinylstyrene, p-vinylstyrene, o-hydroxystyrene, m-hydroxystyrene, p-hydroxystyrene, m-chloromethyl styrene, p-chloromethylstyrene, p-chlorostyrene, p-bromostyrene, p-iodostyrene, p-nitrostyrene, p-cyano styrene, and the like.

Examples of a monomer that gives the structural unit derived from a (meth)acrylic acid ester include:
  (meth)acrylic acid alkyl esters such as methyl (meth)acrylate, ethyl (meth)acrylate, t-butyl (meth)acrylate and 2-ethylhexyl (meth)acrylate;
  (meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;
  (meth)acrylic acid aryl esters such as phenyl (meth)acrylate and naphthyl (meth)acrylate;
  (meth)acrylic acid-substituted alkyl esters such as 2-hydroxyethyl (meth)acrylate, 3-hydroxyadamantyl (meth)acrylate, 3-glycidylpropyl (meth)acrylate and 3-trimethylsilylpropyl (meth)acrylate; and the like.

Examples of a monomer that gives the structural unit derived from substituted or unsubstituted ethylene include:
  ethylene;
  alkenes such as propene, butene and pentene;
  vinylcycloalkanes such as vinylcyclopentane and vinylcyclohexane;
  cycloalkenes such as cyclopentane and cyclohexene;
  4-hydroxy-1-butene; vinyl glycidyl ether; vinyl trimethyl silyl ether; and the like.

The lower limit of a proportion of the structural unit derived from substituted or unsubstituted styrene, the structural unit derived from a (meth)acrylic acid ester, and the structural unit derived from substituted or unsubstituted ethylene contained with respect to total structural units constituting the polymer (A) is preferably 20 mol %, more preferably 40 mol %, and still more preferably 60 mol %. The upper limit of the proportion is, for example, 100 mol %.

Examples of the crosslinkable group include:
  polymerizable carbon-carbon double bond-containing groups such as a vinyl group, a vinyloxy group, an allyl group, a (meth)acryloyl group, and a styryl group;
  cyclic ether groups such as an oxiranyl group, an oxiranyloxy group, an oxetanyl group, and an oxetanyloxy group;
  cyclobutane ring-condensed aryl groups such as a cyclobutane ring-condensed phenyl group, and a cyclobutane ring-condensed naphthyl group;
  aryl groups bonded to an aromatic hydroxy group protected with an acyl group or a heat-labile group, such as an acetoxyphenyl group and a t-butoxyphenyl group;
  aryl groups bonded to a methylol group (—CH$_2$OH) protected with an acyl group or a heat-labile group, such as an acetoxymethylphenyl group and a methoxymethylphenyl group;
  aryl groups bonded to a substituted or unsubstituted sulfanylmethyl group (—CH$_2$SH), such as a sulfanylmethylphenyl group and a methylsulfanylmethylphenyl group; and the like.

The cyclobutane ring-condensed aryl groups form a covalent bond with one another under heating conditions.

The "acyl group" as referred to herein is a group obtained by removing OH from a carboxylic acid, and means a group that protects an aromatic hydroxy group or a methylol group by substituting for a hydrogen atom. The "heat-labile group" as referred to herein is a group that substitutes for a hydrogen atom of an aromatic hydroxy group, a methylol group, or a sulfanylmethyl group, and means a group that dissociates by heating.

Examples of the acyl group in the aryl group bonded to an aromatic hydroxy group, a methylol group or a sulfanylmethyl group each being protected include a formyl group, an acetyl group, a propionyl group, a butyryl group, a benzoyl group, and the like.

Examples of the heat-labile group in the aryl group bonded to a protected aromatic hydroxy group include tertiary alkyl groups such as a t-butyl group and a t-amyl group, and the like. Examples of the heat-labile group in the aryl group bonded to a protected methylol group or sulfanylmethyl group include alkyl groups such as a methyl group, an ethyl group and a propyl group, and the like.

Examples of the structural unit that includes the crosslinkable group include a structural unit derived from a vinyl compound having a crosslinkable group, a structural unit derived from a (meth)acryl compound having a crosslinkable group, and the like.

In the case in which the polymer (A) has the structural unit that includes a crosslinkable group, the lower limit of a proportion of the structural unit that includes a crosslinkable group contained with respect to total repeating units constituting the polymer (A) is preferably 0.1 mol %, more preferably 1 mol %, still more preferably 3 mol %, and particularly preferably 4 mol %. The upper limit of the proportion is preferably 20 mol %, more preferably 15 mol %, still more preferably 10 mol %, and particularly preferably 8 mol %.

The polymer (A) having the functional group (X) at the end of the side chain thereof may also have, in addition to the structural unit (I), an other structural unit (hereinafter, may be also referred to as "structural unit (II)") aside from the structural unit (I).

The structural unit (II) is exemplified by: the aforementioned structural unit derived from substituted or unsubstituted styrene; the aforementioned structural unit derived from (meth)acrylic acid or a (meth)acrylic acid ester; the aforementioned structural unit derived from substituted or unsubstituted ethylene; the aforementioned structural unit that includes a crosslinkable group; and the like.

The polymer (A) having the structural unit (I) and the structural unit (II) may be either a random copolymer or a block copolymer, and in light of further increasing the density of the polymer (A) with which the surface is modified: the block copolymer is preferred; a block copolymer having one type of the structural unit (I) at one end of the main chain thereof is more preferred; and a diblock copolymer having one type of the structural unit (I) and one type of the structural unit (II) is still more preferred.

The lower limit of a proportion of the structural unit (I) in the polymer (A) having the structural unit (I) and the structural unit (II), contained with respect to total structural units constituting the polymer (A), is preferably 0.1 mol %, more preferably 1 mol %, still more preferably 2 mol %, and particularly preferably 3 mol %. The upper limit of the proportion is preferably 50 mol %, more preferably 30 mol %, still more preferably 15 mol %, and particularly preferably 5 mol %. When the proportion of the structural unit (I) falls within the above range, the density of the polymer (A) with which the surface is modified can be further increased.

The lower limit of a number average molecular weight (Mn) of the polymer (A) is preferably 500, more preferably 2,000, still more preferably 4,000, and particularly preferably 5,000. The upper limit of the Mn is preferably 50,000, more preferably 30,000, still more preferably 15,000, and particularly preferably 8,000.

The upper limit of a ratio (Mw/Mn, dispersity index) of a weight average molecular weight (Mw) to the Mn of the polymer (A) is preferably 5, more preferably 2, still more preferably 1.5, and particularly preferably 1.3. The lower limit of the ratio is typically 1, and preferably 1.05.

The lower limit of a content of the polymer (A) with respect to total components other than the solvent (B) in the composition (I) is preferably 80% by mass, more preferably 90% by mass, and still more preferably 95% by mass. The upper limit of the content is, for example, 100% by mass.

Synthesis Procedure of Polymer

The polymer (A) having the functional group (X) at the end of the main chain thereof can be synthesized by living anionic polymerization, living radical polymerization or the like, and living anionic polymerization is preferred. The living anionic polymerization enables: polymerization of a monomer such as styrene in a solvent such as tetrahydrofuran (THF) using an initiator such as sec-butyllithium, for example; and introduction of the functional group (X) at the end of the main chain of the polymer by subjecting a polymerization end to a treatment with an end treatment agent that is capable of giving the functional group (X). The treatment may be carried out by adding 1,1-diphenylethylene or the like, together with the end treatment agent.

Examples of an end treatment agent that is capable of giving the group (I) include boroxine compounds such as 2,4,6-triphenylboroxine, 2,4,6-tri(methylphenyl)boroxine, and 2,4,6-tri(methyloxyphenyl)boroxine, and the like. After the treatment with such an end treatment agent that is capable of giving the group (I), a termination reaction of the polymerization end using methanol or the like is further allowed, thereby enabling the group (I) to be formed.

Examples of an end treatment agent that is capable of giving the group (II) include halides having a carbon-carbon triple bond, such as propargyl bromide, and the like.

A procedure for introducing the group (III) to the end of the main chain is exemplified by a procedure in which a termination reaction is allowed by using an end treatment agent such as acetoxyphenylmethyl bromide, and then a resultant terminal group is deacetylized to form the group (III), and the like.

The polymer (A) having the functional group (X) at the end of the side chain thereof can be synthesized as a block copolymer, a random copolymer or the like by polymerization of, for example, a monomer having the functional group (X) at the end thereof and having an ethylenic carbon-carbon double bond, with as needed, another monomer, through radical polymerization, anionic polymerization, or the like. The polymer (A) having the group (III) at the end of the side chain thereof can be synthesized by, for example: introducing t-butoxystyrene, 1-ethoxyethoxy-4-vinylbenzene or the like to the end through block polymerization or the like; and allowing a thermal dissociation reaction, an acid-catalyzed hydrolysis reaction or the like of a thus resulting polymer to be conducted, whereby the group (III) is generated.

(B) Solvent

The solvent (B) is not particularly limited as long as it is a solvent capable of dissolving or dispersing at least the polymer (A) and the other component(s).

The solvent (B) is exemplified by an alcohol solvent, an ether solvent, a ketone solvent, an amide solvent, an ester solvent, a hydrocarbon solvent, and the like.

Examples of the alcohol solvent include:

aliphatic monohydric alcohol solvents having 1 to 18 carbon atoms such as 4-methyl-2-pentanol and n-hexanol;

alicyclic monohydric alcohol solvents having 18 carbon atoms such as cyclohexanol;

polyhydric alcohol solvents having 2 to 18 carbon atoms such as 1,2-propylene glycol;

polyhydric alcohol partially etherated solvents having 3 to 19 carbon atoms such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole (methyl phenyl ether) and the like.

Examples of the ketone solvent include:

chain ketone solvents such as acetone, methyl ethyl ketone, methyl n-propyl ketone, methyl n-butyl ketone, diethyl ketone, methyl iso-butyl ketone (MIBK), 2-heptanone (methyl-n-pentyl ketone), ethyl n-butyl ketone, methyl n-hexyl ketone, di-iso-butyl ketone, and trimethylnonanone;

cyclic ketone solvents such as cyclopentanone, cyclohexanone, cycloheptanone, cyclooctanone, and methylcyclohexanone;

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as n-butyl acetate and ethyl lactate;

polyhydric alcohol carboxylate solvents such as propylene glycol acetate;

polyhydric alcohol partially etherated carboxylate solvents such as propylene glycol monomethyl ether acetate;

lactone solvents such as γ-butyrolactone and δ-valerolactone;

polyhydric carboxylic acid diester solvents such as diethyl oxalate;

carbonate solvents such as dimethyl carbonate, diethyl carbonate, ethylene carbonate, and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvents are preferred; the polyhydric alcohol partially etherated carboxylate solvents are more preferred, and propylene glycol monomethyl ether acetate is still more preferred. The composition (I) may contain one, or two or more types of the solvent (B).

Other Components

The composition (I) may contain other component(s) in addition to the polymer (A) and the solvent (B). The other components are exemplified by a surfactant and the like.

When the composition (I) contains the surfactant, coatability of the composition (I) when applied on the surface of a base may be improved.

Preparation Procedure of Composition (I)

The composition (I) may be prepared by, for example, mixing the polymer (A), the solvent (B), and as needed the other component(s) at a predetermined ratio, and preferably filtering the resulting mixture through a high-density polyethylene filter or the like having fine pores of about 0.45 μm. The lower limit of a concentration of the composition (I) is preferably 0.1% by mass, more preferably 0.5% by mass, and still more preferably 0.7% by mass. The upper limit of the concentration is preferably 30% by mass, more preferably 10% by mass, and still more preferably 3% by mass.

Heating Step

In this step, a coating film formed by the applying step is heated. Accordingly, formation of a bond between the metal atom (M) in the base surface layer and the functional group (X) of the polymer (A) of the composition (I) is accelerated, whereby the coating film containing the polymer (A) (hereinafter, may be also referred to as "coating film (I)") is laminated on the region (I) of the base surface.

Means for the heating may be, for example, an oven, a hot plate, or the like. The lower limit of the temperature of the heating is preferably 80° C., more preferably 100° C., and still more preferably 130° C. The upper limit of the temperature of the heating is preferably 400° C., more preferably 300° C., and still more preferably 200° C. The lower limit of the time period of the heating is preferably 10 sec, more preferably 1 min, and still more preferably 2 min. The upper limit of the time period of the heating is preferably 120 min, more preferably 10 min, and still more preferably 5 min.

An average thickness of the coating film (I) to be formed may be adjusted to a desired value by appropriately selecting the type and concentration of the polymer (A) in the composition (I), and conditions in the heating step such as the heating temperature and the heating time period. The lower limit of the average thickness of the coating film (I) is preferably 0.1 nm, more preferably 1 nm, and still more preferably 3 nm. The upper limit of the average thickness is, for example, 20 nm.

Removing Step

In this step, a portion of the coating film (I) formed on the region (II) is removed with a rinse agent. Accordingly, a portion that includes the polymer (A) not being bonded to the metal atom (M) after the heating step is removed, whereby a base having a portion of the region (I) being selectively modified is obtained.

The removing in the removing step is typically carried out by rinsing the base after the heating step with a rinse agent. The rinse agent used is typically an organic solvent, and for example, a polyhydric alcohol partially etherated carboxylate solvent such as propylene glycol monomethyl ether acetate, a monohydric alcohol solvent such as isopropanol, or the like may be used.

In the aforementioned manner, convenient modification of the surface region containing a metal atom is enabled with superior selectivity and high density. The base thus obtained may be processed in various ways by carrying out, for example, the following step(s).

Contacting Step

In this step, an alcohol, a dilute acid, a hydrogen peroxide solution, ozone, or plasma is brought into contact with the surface of the base after the removing step. Accordingly, an air-oxidized film layer formed on the region (II) can be removed. The dilute acid is not particularly limited, and examples of the dilute acid include dilute hydrochloric acid, dilute sulfuric acid, dilute nitric add, dilute citric acid, dilute oxalic acid, dilute maleic acid, dilute acetic acid, dilute isobutyric acid, dilute 2-ethylhexanoic acid, and the like.

Depositing Step

In this step, a pattern is deposited on the surface of the base after the removing step by the CVD (chemical vapor deposition) method or the ALD (atom layer deposition) method. Thus, the pattern can be formed selectively on the region (II) not covered by the polymer (A).

Etching Step

In this step, the polymer (A) on the surface of the base after the removing step is removed by etching.

The etching procedure is exemplified by well-known techniques including: reactive ion etching (RIE) such as chemical dry etching carried out using $CF_4$, an $O_2$ gas or the like by utilizing the difference in etching rate of each layer, etc., as well as chemical wet etching (wet development) carried out by using an etching liquid, e.g., an organic solvent, as well as an aqueous solution of an acid such as hydrofluoric acid, acetic acid or citric acid, an alkali such as ammonia, or hydrogen peroxide, or a combination thereof, and physical etching such as sputter etching, ion beam etching, and a gas treatment with $N_2$, $H_2$, $O_2$, and/or the like. Of these, the reactive ion etching is preferred, and the chemical dry etching or the chemical wet etching is more preferred.

Prior to the chemical dry etching, an irradiation with a radioactive ray may be also carried out as needed. As the radioactive ray, when the portion to be removed by etching is a polymer that includes a methyl polymethacrylate block, irradiation with UV or the like may be used. Alternatively, an oxygen plasma treatment may be used. The irradiation with UV or the oxygen plasma treatment results in degradation of the methyl polymethacrylate block phase, thereby facilitating the etching.

Examples of the organic solvent for use in the chemical wet etching include:
- alkanes such as n-pentane, n-hexane and n-heptane;
- cycloalkanes such as cyclohexane, cycloheptane and cyclooctane;
- saturated carboxylic acid esters such as ethyl acetate, n-butyl acetate, i-butyl acetate and methyl propionate;
- ketones such as acetone, methyl ethyl ketone, methyl isobutyl ketone and methyl n-pentyl ketone;
- alcohols such as methanol, ethanol, 1-propanol, 2-propanol and 4-methyl-2-pentanol; and the like. These solvents may be used either alone, or two or more types thereof may be used in combination.

EXAMPLES

Hereinafter, the present invention is explained in detail by way of Examples, but the present invention is not in any way limited to these Examples. The measuring method for each physical property is shown below.

Mw and Mn

The Mw and the Mn of the polymer were determined by gel permeation chromatography (GPC) using GPC columns (Tosoh Corporation; "G2000 HXL"×2, "G3000 HXL"×1 and "G4000 HXL"×1) under the following conditions:
- eluent: tetrahydrofuran (Wako Pure Chemical Industries, Ltd.);
- flow rate: 1.0 mL/min;
- sample concentration: 1.0% by mass;
- amount of sample injected: 100 μL;
- column temperature: 40° C.;
- detector: differential refractometer; and
- standard substance: mono-dispersed polystyrene.

$^{13}$C-NMR Analysis

A $^{13}$C-NMR analysis was performed using a nuclear magnetic resonance apparatus ("JNM-EX400" available from JEOL, Ltd.), with $CDCl_3$ used as a solvent for measurement. The proportion of each structural unit contained in the polymer was calculated from an area ratio of a peak corresponding to each structural unit on the spectrum obtained by the $^{13}$C-NMR.

Synthesis of Polymer (A)

Synthesis Example 1

Synthesis of Polymer A-1)

After a 500 ml, flask as a reaction vessel was dried under reduced pressure, 120 g of THF which had been subjected to a distillation dehydrating treatment was charged in a nitrogen atmosphere, and cooled to −78° C. To this THF was charged 2.37 mL of a 1 N sec-butyllithium (sec-BuLi) solution in cyclohexane. Moreover, 13.3 mL of styrene which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher. Next, 0.718 g of 2,4,6-triphenylboroxine was added thereto and the mixture was stirred for 15 min to introduce to the end of the main chain of the polymer, a structure having a boroxine ring which is opened. Thereafter, 1 mL of methanol was charged to allow for a termination reaction of the polymerization end. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. This operation was repeated four times. The solution was concentrated and the concentrate was added dropwise into 500 g of methanol to allow the polymer to be deposited, and the solid was collected on a Buechner funnel. This polymer was dried under reduced pressure at 60 to give 12.0 g of a white polymer represented by the following formula (A-1). In the following formula (A-1), m is an integer of 1 to 3. With respect to this polymer (A-1): the Mw was 5,400; the Mn was 5,200; and the Mw/Mn was 1.04.

(A-1)

Synthesis Example 2

Synthesis of Polymer (A-2)

After a 500 mL flask as a reaction vessel was dried under reduced pressure, 120 g of THF which had been subjected to a distillation dehydrating treatment was charged in a nitrogen atmosphere, and cooled to −78° C. To this THF was charged 2.37 mL of a 1 N sec-BuLi solution in cyclohexane. Moreover, 13.3 mL, of styrene which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher. Next, 0.818 g of 2,4,6-tri(methylphenyl)boroxine was added thereto and the mixture was stirred for 15 min to introduce to the end of the main chain of the polymer, a structure having a boroxine ring which is opened. Thereafter, 1 mL of methanol was charged to allow for a termination reaction of the polymerization end. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. This operation was repeated four times. The solution was concentrated and the concentrate was added dropwise into 500 g of methanol to allow the polymer to be deposited, and the solid was collected on a Buechner funnel. This polymer was dried under reduced pressure at 60° C. to give 12.1 g of a white polymer represented by the following formula (A-2). In the following formula (A-2), m is an integer of 1 to 3. With respect to this polymer (A-2): the Mw was 5,500; the Mn was 5,300; and the Mw/Mn was 1.04.

(A-2)

Synthesis Example 3

Synthesis of Polymer (A-3)

After a 500 mL flask as a reaction vessel was dried under reduced pressure, 120 g of THF which had been subjected to a distillation dehydrating treatment was charged in a nitrogen atmosphere, and cooled to −78° C. To this THF was charged 2.37 mL of a 1 N sec-BuLi solution in cyclohexane. Moreover, 13.3 mL of styrene which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher. Next, 0.929 g of 2,4,6-tri(methoxyphenyl)boroxine was added thereto and the mixture was stirred for 15 min to introduce to the end of the main chain of the polymer, a structure having a boroxine ring which is opened. Thereafter, 1 mL of methanol was charged to allow for a termination reaction of the polymerization end. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. This operation was repeated four times. The solution was concentrated and the concentrate was added dropwise into 500 g of methanol to allow the polymer to be deposited, and the solid was collected on a Buechner funnel. This polymer was dried under reduced pressure at 60° C. to give 12.3 g of a white polymer represented by the following formula (A-3). In the following formula (A-3), m is an integer of 1 to 3. With respect to this polymer (A-3): the Mw was 5,600; the Mn was 5,300; and the Mw/Mn was 1.06.

(A-3)

Synthesis Example 4

Synthesis of Polymer (A-4)

After a 500 mL flask as a reaction vessel was dried under reduced pressure, 120 g of THF which had been subjected to a distillation dehydrating treatment was charged in a nitrogen atmosphere, and cooled to −78° C. To this THF was charged 2.20 mL of a 1 N sec-BuLi solution in cyclohexane. Moreover, 13.5 mL of tert-butylstyrene which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher. Next, 0.667 g of 2,4,6-triphenylboroxine was added thereto and the mixture was stirred for 15 min to introduce to the end of the main chain of the polymer, a structure having a boroxine ring which is opened, 1 mL of methanol was charged to allow for a termination reaction of the polymerization end. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. This operation was repeated four times. The solution was concentrated and the concentrate was added dropwise into 500 g of methanol to allow the polymer to be deposited, and the solid was collected on a Buechner funnel. This polymer was dried under reduced pressure at 60° C. to give 12.3 g of a white polymer represented by the following formula (A-4).

In the following formula (A-4), m is an integer of 1 to 3. With respect to this polymer (A-4): the Mw was 5,200; the Mn was 4,900; and the Mw/Mn was 1.06.

(A-4)

Synthesis Example 5

Synthesis of Polymer (A-5)

After a 500 mL flask as a reaction vessel was dried under reduced pressure, 120 of THF which had been subjected to a distillation dehydrating treatment was charged in a nitrogen atmosphere, and cooled to −78° C. To this TIM was charged 2.37 mL of a 1 N sec-BuLi solution in cyclohexane. Moreover, 13.3 mL of styrene which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher. Next, a termination reaction of the polymerization end was allowed with 0.971 mL of 1,1-diphenylethylene and 0.274 g of propargyl bromide. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. This operation was repeated four times. The solution was concentrated and the concentrate was added dropwise into 500 g of methanol to allow the polymer to be deposited, and the solid was collected on a Buechner funnel. This polymer was dried under reduced pressure at 60° C. to give 12.1 g of a white polymer represented by the following formula (A-5). With respect to this polymer (A-5): the Mw was 5,500; the Mn was 5,300; and the Mw/Mn was 1.04.

(A-5)

Synthesis Example 6

Synthesis of Polymer (A-6)

After a 500 mL flask as a reaction vessel was dried under reduced pressure, 120 g of THF which had been subjected to a distillation dehydrating treatment was charged in a nitrogen atmosphere, and cooled to −78° C. To this THF was charged 2.20 mL of a 1 N sec-BuLi solution in cyclohexane. Moreover, 13.5 mL of tert-butylstyrene which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher. Next, a termination reaction of the 1.5 polymerization end was allowed with 1.06 mL of 1,1-diphenylethylene and 0.297 g of propargyl bromide. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. This operation was repeated four times. The solution obtained was concentrated and the concentrate was added dropwise into 500 g of methanol to allow the polymer to be deposited, and the solid was collected on a Buechner funnel. This polymer was dried under reduced pressure at 60° C. to give 12.3 g of a white polymer represented by the following formula (A-6). With respect to this polymer (A-6): the Mw was 5,200; the Mn was 4,900; and the Mw/Mn was 1.06.

(A-6)

Synthesis Example 7

Synthesis of Polymer (A-7)

After a 500 mL flask as a reaction vessel was dried under reduced pressure, 120 g of THF which had been subjected to a distillation dehydrating treatment was charged in a nitrogen atmosphere, and cooled to −78° C. To this THF was charged 2.38 mL of a 1 N sec-BuLi solution in cyclohexane. Moreover, 13.3 mL of styrene which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher, and after completion of the dropwise addition, the mixture was stirred for 30 min. Next, 1 mL of methanol as a chain-end terminator was charged to allow for a termination reaction of the polymerization end. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. After this operation was repeated three times to remove oxalic acid, concentration of the solution followed by dropwise addition of the concentrate into 500 g of methanol allowed the polymer to be deposited, and the solid was collected on a Buechner funnel. This solid was dried under reduced pressure at 60° C. to give 11.7 g of a white polymer represented by the following formula (A-7). With respect to this polymer (A-7): the Mw was 5,600; the Mn was 5,300; and the Mw/Mn was 1.06.

(A-7)

Synthesis Example 8

Synthesis of Polymer (A-8)

After a 500 mL flask as a reaction vessel was dried under reduced pressure, 120 g of THF which had been subjected to a distillation dehydrating treatment was charged in a nitrogen atmosphere, and cooled to −78° C. To this THF was charged 2.38 mL of a 1 N sec-BuLi solution in cyclohexane. Moreover, 13.3 mL of styrene which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher, and after completion of the dropwise addition, the mixture was stirred for 30 min. Next, 0.32 mL of 4-chloromethyl-2,2-dimethyl-1,3-dioxolane as a chain-end terminator was charged to allow for a termination reaction of the polymerization end. Next, 10 g of a 1 N aqueous hydrochloric acid solution was added thereto and the mixture was heated at 60° C. for 2 hrs with stirring to allow for a hydrolysis reaction, whereby a polymer having a terminal group including a diol structure was obtained. This reaction solution was cooled to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. After this operation was repeated three times to remove oxalic acid, concentration of the solution followed by dropwise addition of the concentrate into 500 g of methanol allowed the polymer to be deposited, and the solid was collected on a Buechner funnel. This solid was dried under reduced pressure at 60° C. to give 11.3 g of a white polymer represented by the following formula (A-8). With respect to this polymer (A-8): the Mw was 5,300; the Mn was 4,900; and the Mw/Mn was 1.08.

(A-8)

Synthesis Example 9

Synthesis of Polymer (A-9)

After a 500 mL flask as a reaction vessel was dried under reduced pressure, 120 g of THF which had been subjected to a distillation dehydrating treatment was charged in a nitrogen atmosphere, and cooled to −78° C. To this THF were charged 1.02 mL of 1,1-diphenylethylene, 9.59 mL of a 1 M lithium chloride solution in tetrahydrofuran, and 2.47 mL of a 1 N sec-BuLi solution in cyclohexane. Moreover, 12.7 mL of methyl methacrylate which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher, and after completion of the dropwise addition, the mixture was stirred for 120 min. Next, 0.748 g of 2,4,6-triphenylboroxine was added thereto and the mixture was stirred for 15 min, and further, 1 mL of methanol was charged to allow for a termination reaction of the polymerization end. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. After this operation was repeated three times to remove oxalic acid, concentration of the solution followed by dropwise addition of the concentrate into 500 g of methanol allowed the polymer to be deposited, and the solid was collected on a Buechner funnel. This polymer was dried under reduced pressure at 60° C. to give 12.3 g of a white polymer (A-9). With respect to this polymer (A-9): the Mw was 5,000; the Mn was 4,800; and the Mw/Mn was 1.04.

(A-9)

Synthesis Example 10

Synthesis of Polymer (A-10)

After a 500 mL flask as a reaction vessel was dried under reduced pressure, 120 g of THF which had been subjected to a distillation dehydrating treatment was charged in a nitrogen atmosphere, and cooled to −78° C. To this THF were charged 1.02 mL of 1,1-diphenylethylene, 9.59 mL of a 1 M lithium chloride solution in tetrahydrofuran, and 2.47 mL, of a 1 N sec-BuLi solution in cyclohexane. Moreover, 12.7 mL of methyl methacrylate which had been subjected to adsorptive filtration by means of silica gel for removing a polymerization inhibitor and to a dehydration treatment by distillation was added dropwise over 30 min. During the dropwise addition, the internal temperature of the reaction mixture was carefully controlled so as not to be −60° C. or higher, and after completion of the dropwise addition, the mixture was stirred for 120 min. Next, 0.285 g of propargyl bromide was added thereto and the mixture was stirred for 15 min to allow for a termination reaction. The temperature of the reaction mixture was elevated to room temperature, and the reaction mixture thus obtained was concentrated, followed by replacement of the solvent with MIBK. Subsequently, 1,000 g of a 2% by mass aqueous oxalic acid solution was charged and the mixture was stirred and left to stand, and then the aqueous underlayer was removed. This operation was repeated three times to remove the Li salt. Then, 1,000 g of ultra pure water was charged and the mixture was stirred and left to stand, and then the aqueous underlayer was removed. After this operation was repeated three times to remove oxalic acid, concentration of the solution followed by dropwise addition of the concentrate into 500 g of methanol allowed the polymer to be deposited, and the solid was collected on a Buechner funnel. This polymer was dried under reduced pressure at 60° C. to give 12.3 g of a white polymer (A-10). With respect to this polymer (A-10): the Mw was 5,100; the Mn was 4,900; and the Mw/Mn was 1.04.

(A-10)

Synthesis Example 11

Synthesis of Polymer (A-11)

After a 500 mL flask as a reaction vessel was dried under reduced pressure, 120 g of tetrahydrofuran which had been subjected to a distillation dehydrating treatment was charged in a nitrogen atmosphere, and cooled to −78° C. Thereafter, 1.50 mL of a 1 N sec-BuLi solution in cyclohexane was charged into this tetrahydrofuran and then 9.4 mL of styrene which had been subjected to adsorptive filtration by means of silica gel for removing a polymerization inhibitor and to a dehydration treatment by distillation was added dropwise over 20 min. The polymerization system was confirmed to have an orange color. Furthermore, 1.10 mL of Cert-butoxystyrene was charged with a syringe and the polymerization system was confirmed to have a dark red color. During the dropwise addition, the internal temperature of the reaction mixture was carefully controlled so as not to be −60° C. or higher. The charging of tert-butoxystyrene was followed by aging for 60 mi. Subsequently, 0.5 mL of methanol was charged to allow for a termination reaction of the polymerization end. The temperature of the reaction mixture was elevated to the room temperature, and the reaction mixture thus obtained was concentrated, followed by replacement of the solvent with MIBK. Thereafter, 1,000 g of 2% aqueous oxalic acid solution was charged and the mixture was stirred and left to stand, and then the aqueous underlayer was removed. This operation was repeated three times to remove metal Li. Then, 1,000 g of ultra pure water was charged and the mixture was stirred and left to stand, and then the aqueous underlayer was removed. After this operation was repeated three times to remove oxalic acid, concentration of the solution followed by dropwise addition of the concentrate into 500 g of methanol allowed the polymer to be deposited, and the solid was collected on a Buechner funnel. Next, 100 g of propylene glycol monomethyl ether acetate and 1.0 g of p-toluenesulfonic acid were added to this polymer, and refluxed by heating at 160° C. for 5 hrs. After this polymer was diluted with 300 g of MIBK, 500 g of ultra pure water was charged and the mixture was stirred and left to stand, and then the aqueous underlayer was removed. After this operation was repeated three times to remove p-toluenesulfonic acid, concentration of the solution followed by dropwise addition of the concentrate into 500 g of methanol allowed the polymer to be deposited, and the solid was collected on a Buechner funnel. Drying under reduced pressure at 60° C. gave 13.3 g of a white block copolymer (A-11). With respect to the block copolymer (A-11): the Mw was 5,200; the Mn was 4,900; and the Mw/Mn was 1.06.

(A-11)

Synthesis Example 12

Synthesis of Polymer (A-12)

Into a 200 mL three-neck flask, 0.29 g of bisbenzyltrithiocarbonate, 0.049 g of azoisobutyronitrile, 12.0 g of styrene, and 20 g of anisole were added, and the mixture was heated at 80° C. for 5 hrs with stirring under nitrogen. Next, 0.098 g of azoisobutyronitrile was added thereto and the mixture was heated at 80° C. for 3 hrs with stirring under nitrogen. Subsequently, purification by precipitation with 500 g of methanol was permitted, followed by dissolution in 20 g of propylene glycol monomethyl ether acetate. Thereto were added 0.74 g of n-butylamine and 2 g of propylene glycol monomethyl ether, and the mixture was heated at 60° C. for 2 hrs with stirring under nitrogen. Subsequently, the polymerization solution was concentrated and diluted with 10 g of tetrahydrofuran, followed by purification by precipitation with 500 g of methanol. A white solid thus obtained was dried under reduced pressure to give 10.0 g of a white solid. Next, after this white solid was dissolved in 20 g of propylene glycol monomethyl ether acetate, 0.15 g of 4-allyl pyrocatechol and 0.049 g of azoisobutyronitrile were added thereto to allow for an ene-thiol reaction. Accordingly, an aromatic hydroxy group was introduced to the end of the polymer, whereby a polymer (A-12) was obtained. With respect to this polymer (A-12): the Mn was 6,800; the Mw was 8,300; and the Mw/Mn was 1.22.

(A-12)

Preparation of Composition

Preparation Example 1

A composition (S-1) was prepared by: adding to 1.2 g of (A-1) as the polymer (A), 98.8 g of propylene glycol monomethyl ether acetate (PGMEA) as the solvent (B); stirring the mixture; and then filtering the stirred mixture through a high-density polyethylene filter with fine pores of 0.45 μm.

Preparation Examples 2 to 12

Compositions (S-1) to (S-12) were prepared similarly to Preparation Example 1 except that each component of the type and in the amount shown in Table 1 below was used.

TABLE 1

| | | | Preparation Example | | | | | | | | | | | |
|---|---|---|---|---|---|---|---|---|---|---|---|---|---|---|
| Amount (mass (g)) | | | 1 | 2 | 3 | 4 | 5 | 6 | 7 | 8 | 9 | 10 | 11 | 12 |
| Composition | | | S-1 | S-2 | S-3 | S-4 | S-5 | S-6 | S-7 | S-8 | S-9 | S-10 | S-11 | S-12 |
| (A) Polymer | A-1 | PS-ω-PhBOH | 1.2 | | | | | | | | | | | |
| | A-2 | PS-ω-PhMeBOH | | 1.2 | | | | | | | | | | |
| | A-3 | PS-ω-PhOMeBOH | | | 1.2 | | | | | | | | | |
| | A-4 | tBuSt-ω-PhBOH | | | | 1.2 | | | | | | | | |
| | A-5 | PS-ω-alkyne | | | | | 1.2 | | | | | | | |
| | A-6 | tBuSt-ω-alkyne | | | | | | 1.2 | | | | | | |
| | A-7 | PS-ω-H | | | | | | | 1.2 | | | | | |
| | A-8 | PS-ω-DOH | | | | | | | | 1.2 | | | | |
| | A-9 | PMMA-ω-PhBOH | | | | | | | | | 1.2 | | | |
| | A-10 | PMMA-ω-alkyne | | | | | | | | | | 1.2 | | |
| | A-11 | PS-b-PHS-ω-H | | | | | | | | | | | 1.2 | |
| | A-12 | α-Bz-PS-ω-S-Ph(OH)$_2$ | | | | | | | | | | | | 1.2 |
| (B) Solvent | B-1 | PGMEA | 98.8 | 98.8 | 98.8 | 98.8 | 98.8 | 98.8 | 98.8 | 98.8 | 98.8 | 98.8 | 98.8 | 98.8 |

Modification of Base Surface

Comparative Examples 1 to 6 and Examples 1 to 28

Eight-inch substrates (copper substrate, cobalt substrate, tungsten substrate) were immersed in a 5% by mass aqueous oxalic acid solution, and then dried with a nitrogen flow to remove oxidized coating films on the surfaces. The silicon oxide substrate was subjected to a surface treatment with isopropanol.

Next, compositions shown in Table 2 below were each spin-coated by using Track ("TELDSA ACT8" available from Tokyo Electron Limited) at 1,500 rpm, and baked at 150° C. for 180 sec. The substrate was subjected to exfoliation with PGMEA to remove unreacted polymer. The selective surface modification material formed on the substrate was found to have a thickness of about 0 nm to 5 nm as a result of the measurement of the film thickness with an ellipsometer. Next, the surface contact angle value was measured by using a contact angle meter ("Drop master DM-501" available from Kyowa Interface Science Co., LTD.). Furthermore, arrangement density σ (chains/nm²) of the polymer (A) (brush) was calculated on the basis of the measured film thickness according to the following equation (X):

$$\sigma = d \times L \times NA \times 10^{-21}/Mn \quad (X)$$

d: density (g/cm³) of the polymer (A); L: average thickness (nm) of the film; NA: Avogadro's number; and Mn: number average molecular weight of the polymer (A).

With respect to each metal substrate and each silicon oxide substrate, the average thickness (Thickness (nm)), the contact angle value (SCA (°)) and the polymer (brush) density (Brush density (chains/nm²)) of the polymer film formed on the surface of the substrate are shown in Table 2 below, respectively. In Table 2, "—" denotes that base selectivity was not demonstrated, and the arrangement density of the polymer was not calculated.

TABLE 2

| Copper substrate | | Sample Composition | Thickness (nm) | | SCA (°) | | Brush density (chains/nm$^2$) |
|---|---|---|---|---|---|---|---|
| | | | | | Copper | Si oxide | |
| | | (Control) | Copper | Si oxide | 10 | 36 | |
| Comparative Example 1 | S-7 | PS-ω-H | 0.7 | 0.6 | 42 | 45 | — |
| Comparative Example 2 | S-8 | PS-ω-DOH | 4.1 | 4.2 | 88 | 89 | — |
| Example 1 | S-1 | PS-ω-PhBOH | 3.5 | 0.3 | 87 | 39 | 0.37 |
| Example 2 | S-2 | PS-ω-PhMeBOH | 3.7 | 0.3 | 88 | 39 | 0.59 |
| Example 3 | S-3 | PS-ω-PhOMeBOH | 3.8 | 0.3 | 88 | 38 | 0.46 |
| Example 4 | S-4 | tBuSt-ω-PhBOH | 3.6 | 0.9 | 89 | 39 | 0.44 |
| Example 5 | S-5 | PS-ω-alkyne | 3.6 | 0.9 | 89 | 38 | 0.41 |
| Example 6 | S-6 | tBuSt-ω-alkyne | 4.2 | 0.5 | 89 | 37 | 0.52 |
| Example 7 | S-9 | PMMA-ω-PhBOH | 4.2 | 0.6 | 70 | 36 | 0.52 |
| Example 8 | S-10 | PMMA-ω-alkyne | 4.2 | 0.5 | 72 | 37 | 0.52 |
| Example 23 | S-11 | PS-b-PHS-ω-H | 3.8 | 0.5 | 90 | 41 | 0.48 |
| Example 24 | S-12 | α-Bz-PS-ω-S-Ph(OH)2 | 3.6 | 0.8 | 89 | 43 | 0.33 |

| cobalt substrate | | Sample Composition | Thickness (nm) | | SCA (ω) | | |
|---|---|---|---|---|---|---|---|
| | | | | | Cobalt | Si oxide | |
| | | (control) | Cobalt | Si oxide | 10 | 36 | |
| Comparative Example 3 | S-7 | PS-ω-H | 0.6 | 0.7 | 42 | 45 | — |
| Comparative Example 4 | S-8 | PS-ω-DOH | 3.7 | 3.6 | 89 | 88 | — |
| Example 9 | S-1 | PS-ω-PhBOH | 3.6 | 0.3 | 87 | 38 | 0.38 |
| Example 10 | S-2 | PS-ω-PhMeBOH | 3.7 | 0.3 | 88 | 39 | 0.59 |
| Example 11 | S-3 | PS-ω-PhOMeBOH | 3.8 | 0.3 | 88 | 38 | 0.46 |
| Example 12 | S-4 | tBuSt-ω-PhBOH | 3.6 | 0.9 | 89 | 39 | 0.44 |
| Example 13 | S-5 | PS-ω-alkyne | 3.6 | 0.9 | 89 | 38 | 0.41 |
| Example 14 | S-6 | tBuSt-ω-alkyne | 4.2 | 0.5 | 89 | 37 | 0.52 |
| Example 15 | S-9 | PMMA-ω-PhBOH | 4.2 | 0.6 | 71 | 38 | 0.52 |
| Example 16 | S-10 | PMMA-ω-alkyne | 4.1 | 0.5 | 72 | 37 | 0.50 |
| Example 25 | S-11 | PS-b-PHS-ω-H | 3.9 | 0.6 | 89 | 42 | 0.49 |
| Example 26 | S-12 | α-Bz-PS-ω-S-Ph(OH)2 | 3.7 | 0.7 | 89 | 43 | 0.34 |

| tungsten substrate | | Sample Composition | Thickness (nm) | | SCA (°) | | Brush density (chains/nm$^2$) |
|---|---|---|---|---|---|---|---|
| | | | | | Tungsten | Si oxide | |
| | | (control) | Tungsten | Si oxide | 10 | 36 | |
| Comparative Example 5 | S-7 | PS-ω-H | 0.6 | 0.6 | 43 | 44 | — |
| Comparative Example 6 | S-8 | PS-ω-DOH | 3.6 | 3.6 | 89 | 89 | — |
| Example 17 | S-1 | PS-ω-PhBOH | 3.6 | 0.3 | 87 | 38 | 0.38 |
| Example 18 | S-4 | tBuSt-ω-PhBOH | 3.6 | 0.9 | 89 | 39 | 0.44 |
| Example 19 | S-5 | PS-ω-alkyne | 3.6 | 0.9 | 89 | 38 | 0.41 |
| Example 20 | S-6 | tBuSt-ω-alkyne | 4.2 | 0.5 | 89 | 37 | 0.52 |
| Example 21 | S-9 | PMMA-ω-PhBOH | 4.1 | 0.7 | 71 | 38 | 0.50 |
| Example 22 | S-10 | PMMA-ω-alkyne | 4.2 | 0.5 | 72 | 37 | 0.52 |
| Example 27 | S-11 | PS-b-PHS-ω-H | 3.6 | 0.6 | 89 | 42 | 0.46 |
| Example 28 | S-12 | α-Bz-PS-ω-S-Ph(OH)2 | 3.7 | 0.7 | 88 | 41 | 0.34 |

Selective Modification of Stripe Base Surface of Copper-Silicon Oxide

Comparative Examples 7 and 8, and Examples 29 to 36

Figure 1:
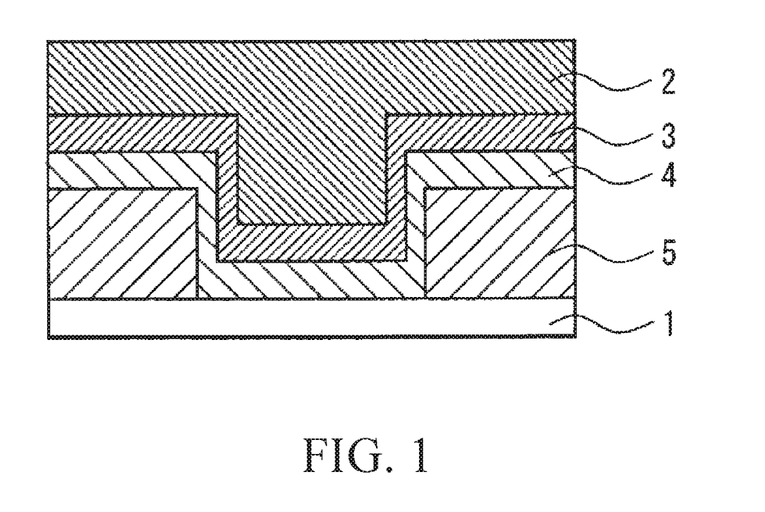
FIG. 1 is a cross sectional view illustrating a substrate for producing a striped base.
Figure 2:
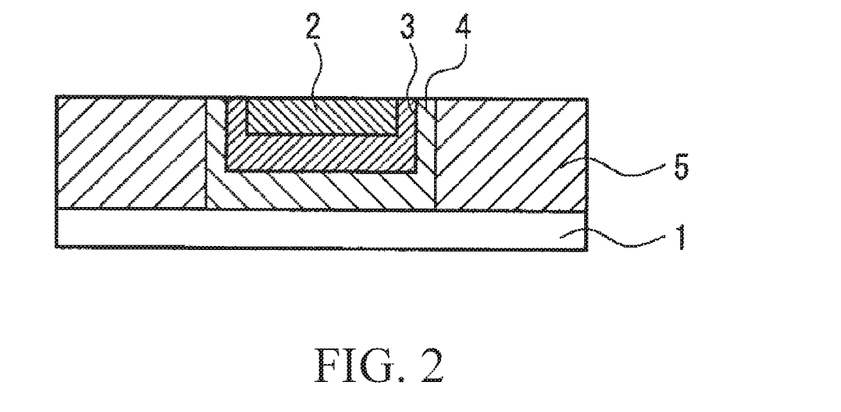
FIG. 2 is a cross sectional view illustrating a striped base used for evaluation of a modification method of a surface.

An eight-inch substrate shown in FIG. 1 (Cu-EPC 2: 10,000 Å/Cu-Seed 3: 1,000 Å/TaN Barrier Layer 4: 250 Å/silicon oxide 5: 5,000 Å/silicon wafer 1, 0.18 µm trench) was ground with a CMP slurry to produce a base including copper and silicon oxide arranged in a striped shape as shown in FIG. 2. Next, this base was immersed in a 5% by mass aqueous oxalic acid solution and thereafter dried with a nitrogen flow, whereby the oxidized coating film on the surface was removed.

The compositions shown in Table 3 below were each spin-coated on the base by using Track ("TELDSA ACTS" available from Tokyo Electron Limited) at 1,500 rpm, and baked at 150° C. for 180 sec. The base was subjected to exfoliation with PGMEA to remove unreacted polymer. Next, the surface was observed under a scanning probe microscope ("S-image" (microscope unit) and "Nano Mavi Real" (control station) available from Hitachi High-Technologies Science Corporation), and the film thickness of the coating was calculated from the recess(es) and protrusion(s).

The average thickness (Thickness (nm)) of each coating film of the polymer formed on each region containing copper or silicon oxide on the copper-silicon oxide striped base is shown in Table 3. In Table 3, "ND" indicates that the thickness was so small that the detection failed.

TABLE 3

Copper-silicon oxide striped base

| | | | Thickness (nm) | |
|---|---|---|---|---|
| | Composition | Sample | Copper | Si oxide |
| Comparative Example 7 | S-7 | PS-ω-H | ND | ND |
| Comparative Example 8 | S-8 | PS-ω-DOH | 4.5 | 4.6 |
| Example 29 | S-1 | PS-ω-PhBOH | 3.5 | ND |
| Example 30 | S-2 | PS-ω-PhMeBOH | 3.7 | ND |
| Example 31 | S-3 | PS-ω-PhOMeBOH | 3.8 | ND |
| Example 32 | S-4 | tBuSt-ω-PhBOH | 3.6 | ND |
| Example 33 | S-5 | PS-ω-alkyne | 3.6 | ND |
| Example 34 | S-9 | PMMA-ω-PhBOH | 3.9 | ND |
| Example 35 | S-10 | PMMA-ω-alkyne | 3.8 | ND |
| Example 36 | S-11 | PS-b-PHS-ω-H | 3.8 | ND |

From the results shown in Tables 2 and 3, it was verified that the modification method of a surface of a base according to the Examples enabled convenient modification of the surface region containing the metal atom, with high selectivity and high density.

According to the modification method of a surface of a base, and the composition and the polymer of the embodiments of the present invention, convenient modification of a surface region containing a metal atom is enabled, with high selectivity and high density. Therefore, the modification method of a surface of a base, and the composition and the polymer can be suitably used for working processes of semiconductor devices, and the like, in which microfabrication is expected to progress further hereafter.

Obviously, numerous modifications and variations of the present invention are possible in light of the above teachings. It is therefore to be understood that within the scope of the appended claims, the invention may be practiced otherwise than as specifically described herein.

What is claimed is:

1. A modification method of a surface of a base comprising:
applying a composition on a surface layer of a base to form a coating film, the surface layer comprising a first region which comprises a metal atom and a second region which does not comprise the metal atom included in the first region;
heating the coating film; and
removing with a rinse agent a portion of the coating film formed on the second region while keeping a portion of the coating film formed on the first region remained,
wherein the composition comprises a polymer and a solvent,
the polymer comprising:
a main chain comprising at least one structural unit selected from the group consisting of: a structural unit derived from substituted or unsubstituted styrene; a structural unit derived from (meth)acrylic acid or a (meth)acrylic acid ester; and a structural unit derived from substituted or unsubstituted ethylene; and
a functional group attached to at least one end of the main chain, the functional group being at least one selected from the group consisting of: a group represented by a formula (1); a group comprising a carbon-carbon triple bond; and a group comprising an aromatic hydroxy group:

wherein, in the formula (1), $R^1$ represents a hydrogen atom or a monovalent organic group having 1 to 20 carbon atoms; and n is an integer of 1 to 10, wherein in a case in which n is no less than 2, a plurality of $R^1$s are identical or different.

2. The modification method according to claim 1, wherein the second region substantially consists of at least one nonmetal atom.

3. The modification method according to claim 1, further comprising bringing alcohol, dilute acid, an aqueous hydrogen peroxide solution, ozone or plasma into contact with a surface of the base after the removing.

4. The modification method according to claim 1, further comprising depositing a pattern, by a CVD process or an ALD process, on a surface of the base after the removing.

5. The modification method according to claim 1, further comprising eliminating by etching, the polymer on the surface of the base after the removing.

6. The modification method according to claim 1, wherein the metal atom constitutes a metal simple substance, an alloy, an electrically conductive nitride, or a silicide.

7. The modification method according to claim 1, wherein the metal atom is a copper atom, an iron atom, a zinc atom, a cobalt atom, an aluminum atom, a titanium atom, a tin atom, a tungsten atom, a zirconium atom, a tantalum atom, a germanium atom, a molybdenum atom, a ruthenium atom, a gold atom, a silver atom, a platinum atom, a palladium atom, or a nickel atom.

8. The modification method according to claim 1, wherein a polystyrene-equivalent number average molecular weight of the polymer is no less than 500 and no greater than 50,000.

9. The modification method according to claim 1, wherein the metal atom constitutes a copper simple substance, a cobalt simple substance, a tungsten simple substance, a tantalum simple substance, or tantalum nitride.

10. The modification method according to claim 1, wherein the second region comprises a nonmetal atom which constitutes a nonmetal simple substance, a nonmetal oxide, a nonmetal nitride, or a nonmetal oxidenitride.

11. The modification method according to claim 10, wherein the nonmetal atom constitutes a silicon oxide.

12. The modification method according to claim 1, wherein the functional group is at least one selected from the group consisting of: a group represented by the formula (1); and a group comprising a carbon-carbon triple bond.

13. The modification method according to claim 1, wherein the functional group is a group comprising a carbon-carbon triple bond.

14. The modification method according to claim 1, wherein the main chain is a block copolymer which comprises the at least one structural unit.

15. The modification method according to claim 1, wherein the main chain is a diblock copolymer which comprises the at least one structural unit.

16. The modification method according to claim 1, wherein a polystyrene-equivalent number average molecular weight of the polymer is no less than 2,000 and no greater than 30,000.

17. The modification method according to claim 1, wherein a polystyrene-equivalent number average molecular weight of the polymer is no less than 4,000 and no greater than 15,000.

18. The modification method according to claim 1, wherein a polystyrene-equivalent number average molecular weight of the polymer is no less than 5,000 and no greater than 8,000.

* * * * *